(12) United States Patent
Hyun et al.

(10) Patent No.: US 12,177,998 B2
(45) Date of Patent: Dec. 24, 2024

(54) DISPLAY APPARATUS AND METHOD OF MANUFACTURING DISPLAY APPARATUS

(71) Applicant: SAMSUNG DISPLAY CO., LTD., Yongin-si (KR)

(72) Inventors: Changho Hyun, Yongin-si (KR); Joonhee Song, Yongin-si (KR); Kyemoon Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 183 days.

(21) Appl. No.: 18/081,310

(22) Filed: Dec. 14, 2022

(65) Prior Publication Data
US 2023/0189466 A1    Jun. 15, 2023

(30) Foreign Application Priority Data
Dec. 15, 2021 (KR) .......................... 10-2021-0179960

(51) Int. Cl.
*H05K 5/03* (2006.01)
*H10K 50/84* (2023.01)
*H10K 71/00* (2023.01)
*H10K 59/12* (2023.01)

(52) U.S. Cl.
CPC ............. *H05K 5/03* (2013.01); *H10K 50/841* (2023.02); *H10K 71/00* (2023.02); *H10K 59/12* (2023.02); *H10K 59/1201* (2023.02)

(58) Field of Classification Search
CPC ....................................................... H05K 5/03
See application file for complete search history.

(56) References Cited

U.S. PATENT DOCUMENTS

| | | | |
|---|---|---|---|
| 2016/0066413 A1 | 3/2016 | Kim et al. | |
| 2018/0203483 A1* | 7/2018 | Kwak | H04M 1/0266 |
| 2020/0012142 A1 | 1/2020 | Kim et al. | |
| 2020/0233469 A1* | 7/2020 | Won | G06F 1/1626 |
| 2020/0241678 A1* | 7/2020 | Yeom | G06F 3/016 |
| 2020/0280807 A1* | 9/2020 | Kim | H04R 1/028 |

FOREIGN PATENT DOCUMENTS

| | | |
|---|---|---|
| KR | 1020160027776 A | 3/2016 |
| KR | 20190044406 A | 4/2019 |
| KR | 20200005710 A | 1/2020 |

* cited by examiner

*Primary Examiner* — Sherman Ng
(74) *Attorney, Agent, or Firm* — CANTOR COLBURN LLP

(57) ABSTRACT

A display apparatus includes a substrate including a display area and a peripheral area surrounding the display area, a display layer disposed on the display area, a cover window covering the substrate, and a cover panel disposed on the substrate, where the substrate is disposed between the cover window and the cover panel. The cover panel includes a body portion covering the substrate, and a buffer portion extending from a side of the body portion and disposed between the substrate and the cover window.

20 Claims, 13 Drawing Sheets

DISPLAY APPARATUS AND METHOD OF MANUFACTURING DISPLAY APPARATUS

CROSS-REFERENCE TO RELATED APPLICATION

This application claims priority to Korean Patent Application No. 10-2021-0179960, filed on Dec. 15, 2021, and all the benefits accruing therefrom under 35 U.S.C. § 119, the content of which in its entirety is herein incorporated by reference.

BACKGROUND

1. Field

One or more embodiments relate to a display apparatus and a method of manufacturing the display apparatus, and more particularly, to a display apparatus, in which damage to a substrate is prevented, and a method of manufacturing the display apparatus.

2. Description of the Related Art

Electronic devices, such as smartphones, digital cameras, notebook computers, navigation systems, and smart televisions, which provide images to users, include display apparatuses for displaying images. A display apparatus generate images and provide the images to users through a display screen thereof.

Recently, the use of display apparatuses has been diversified, and various types of display apparatus have been developed with the development of display apparatus technology. For example, flexible display apparatuses which are easy to carry and may improve user convenience have been developed.

Recently, as components for driving display apparatuses are miniaturized, the proportion of the display apparatuses in electronic devices has gradually increased, and a structure that may be bent to have a certain angle from a flat state has been developed.

SUMMARY

In general, a display apparatus includes a display panel and a cover window covering the display panel. In such a display apparatus, while some empty space is formed between the display panel and the cover window, when an external force is applied to an area in which the empty space is formed, the display panel may be damaged.

One or more embodiments include a display apparatus capable of preventing damage to a substrate and a method of manufacturing the display apparatus.

According to one or more embodiments, a display apparatus includes a substrate including a display area and a peripheral area surrounding the display area, a display layer disposed on the display area, a cover window covering the substrate, and a cover panel disposed on the substrate, where the substrate is disposed between the cover window and the cover panel, and the cover panel includes a body portion covering the substrate, and a buffer portion extending from a side of the body portion and disposed between the substrate and the cover window.

In an embodiment, the buffer portion may be disposed in the peripheral area.

In an embodiment, the display apparatus may further include a circuit board disposed on the cover panel, where the cover panel is disposed between the circuit board and the substrate, and the circuit board may be connected to the substrate by a connection portion.

In an embodiment, the peripheral area may include a connection area to which the connection portion is connected, where the buffer portion may be disposed on opposing side portions of the connection area.

In an embodiment, the buffer portion may be provided in plural, and the connection portion may be arranged between a plurality of buffer portions.

In an embodiment, the buffer portion may be bent to surround a side portion of the substrate.

In an embodiment, the buffer portion may be in contact with the substrate and the cover window.

In an embodiment, an edge of the buffer portion may correspond to an edge of the peripheral area.

In an embodiment, the display apparatus may further include a spacer disposed between the substrate and the cover window in the peripheral area, where the buffer portion may be disposed between the substrate and the cover window in the peripheral area and may not overlap the spacer in a thickness direction of the substrate.

In an embodiment, the buffer portion and the spacer may include different materials from each other.

In an embodiment, the buffer portion may be integrally formed with the spacer as a single unitary indivisible part.

In an embodiment, the buffer portion may have a rhombus shape in a plan view.

In an embodiment, the cover panel may include a first layer and a second layer, which are disposed opposite to each other, and a plurality of support members between the first layer and the second layer and connected to the first layer and the second layer.

In an embodiment, the plurality of support members may be apart from each other at a same interval and arranged side-by-side.

In an embodiment, the plurality of support members may be disposed to cross each other.

According to one or more embodiments, a method of manufacturing a display apparatus includes providing a display layer on a display area of a substrate, where the substrate includes the display area and a peripheral area surrounding the display area, attaching a cover panel to the substrate in a way such that the display layer is disposed between the cover panel and the substrate, bending a buffer portion of the cover panel extending from a side of the cover panel in a way such that the buffer portion is disposed on the peripheral area of the substrate, and disposing a cover window to cover the buffer portion and the display layer.

In an embodiment, the method may further include disposing a circuit board on the cover panel in a way such that the cover panel is disposed between the circuit board and the substrate, and connecting the circuit board to the substrate by a connection portion.

In an embodiment, the buffer portion may be provided in plural, and the method may further include disposing the connection portion between a plurality of buffer portions.

In an embodiment, the method may further include disposing the buffer portion on opposing side portions of the peripheral area.

In an embodiment, the cover panel may include a first layer and a second layer, which are disposed opposite to each other, and a plurality of support members disposed between the first layer and the second layer and connected to the first layer and the second layer.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
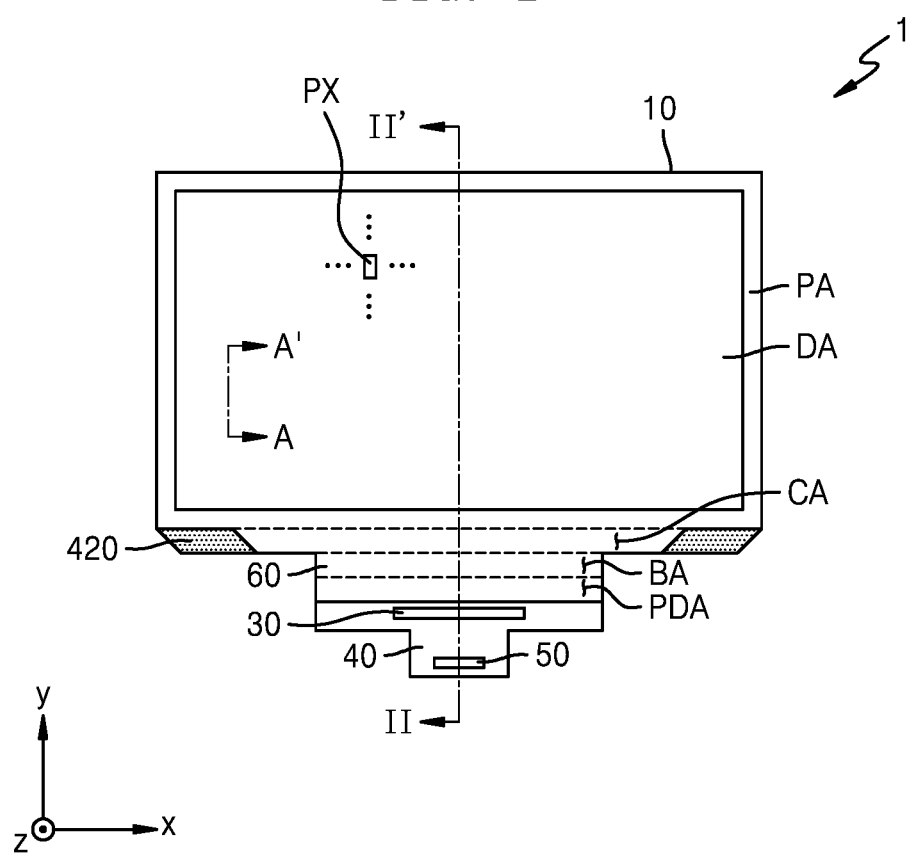
FIG. 1 is a schematic plan view of a portion of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. The components that are the same or are in correspondence are labeled with the same reference numeral in the drawings, and any repetitive detailed description thereof may be omitted or simplified As the disclosure allows for various changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

The components that are the same or are in correspondence are labeled with the same reference numeral in the drawings, and any repetitive detailed description thereof may be omitted or simplified.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present.

Sizes of elements in the drawings may be exaggerated for convenience of explanation. In other words, since sizes and thicknesses of components in the drawings are arbitrarily illustrated for convenience of explanation, the following embodiments are not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order. Hereinafter, a display apparatus according to an embodiment of the disclosure will be described with reference to the drawings.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
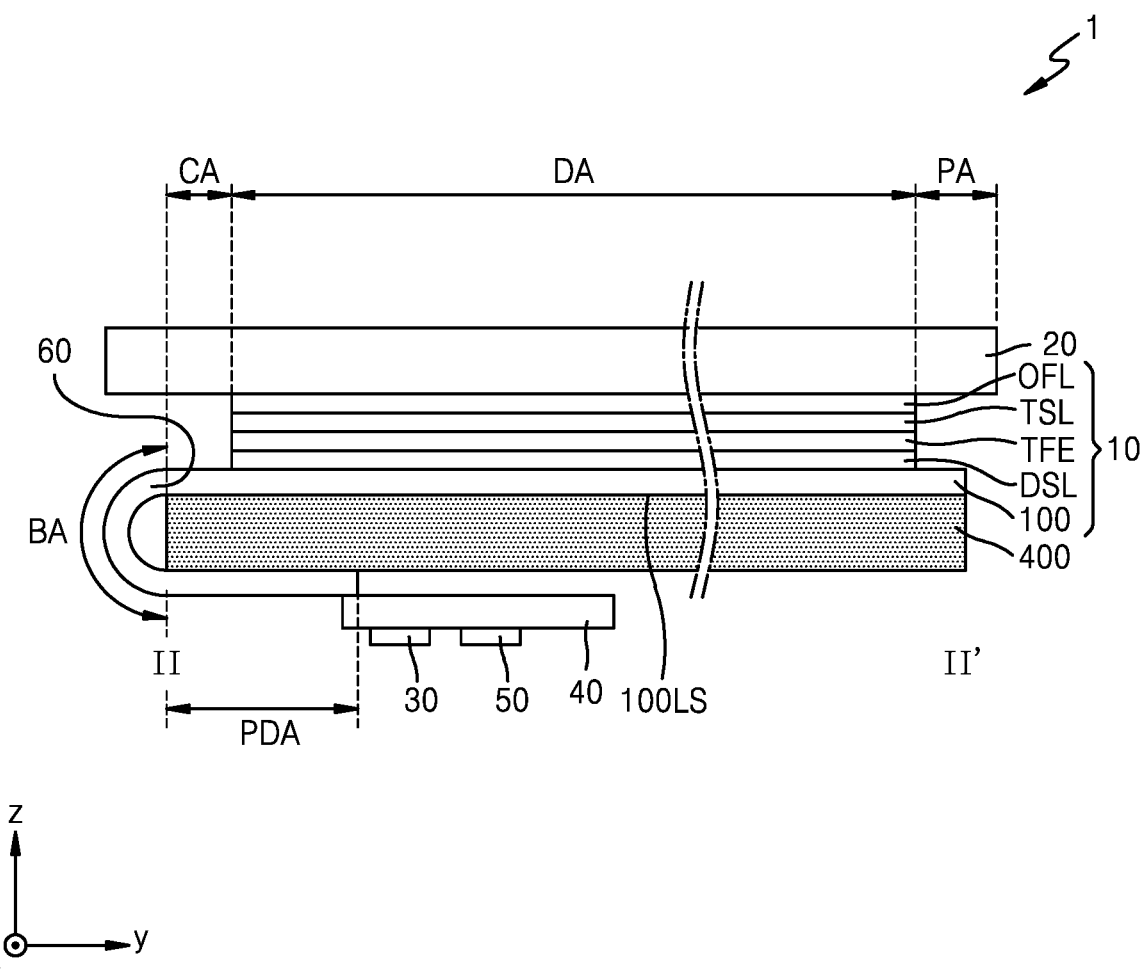
FIG. 2 is a schematic side view of the display apparatus including a component shown in FIG. 1.
Figure 3:
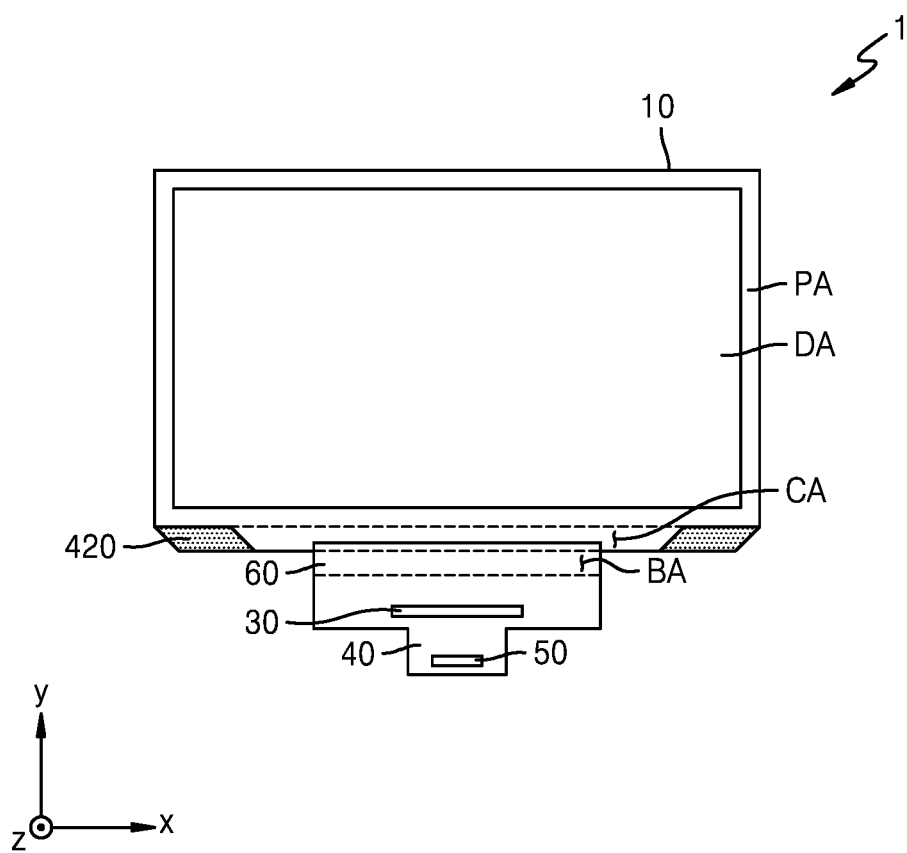
FIG. 3 is a schematic plan view of a portion of a display apparatus according to an alternative embodiment.

FIG. 1 is a schematic plan view of a portion of a display apparatus according to an embodiment, and FIG. 2 is a schematic side view of a display apparatus including a component shown in FIG. 1. In FIG. 2, an embodiment in which a substrate 100 is a flexible substrate and thus a display panel 10 has a bent shape in a bending area BA is illustrated. In FIG. 1, the display panel 10 is illustrated not bent for convenience. FIG. 3 is a schematic plan view of a portion of a display apparatus according to an alternative embodiment.

Referring to FIG. 1, an embodiment of a display apparatus 1 is an apparatus that displays a moving image or still image, and may be used as display screens of various products, such as a television, a notebook computer, a monitor, a billboard, and the Internet of Things ("IOT"), as well as portable electronic devices, such as a mobile phone, a smartphone, a tablet personal computer, a mobile communication terminal, an electronic notebook, an e-book, a portable multimedia player ("PMP"), a navigation system, and an ultra mobile personal computer ("UMPC"). In addition, the display apparatus 1 according to an embodiment may be used in wearable devices, such as a smart watch, a watch phone, a glasses display, and a head mounted display ("HMD"). In an embodiment, the display apparatus 1 may be used as a dashboard of a vehicle, a center information display ("CID") disposed in a center fascia or dashboard of a vehicle, a room mirror display that replaces a side mirror of a vehicle, entertainment for the rear seat of a vehicle, or a display placed on the back of the front seat of a vehicle.

In an embodiment, the display apparatus 1 may approximately have a rectangular shape, as shown in FIG. 1. In an embodiment, for example, as shown in FIG. 1, the display apparatus 1 may have a rectangular planar shape having a long side extending in a first direction (e.g., an x direction or −x direction) and a short side extending in a second direction (e.g., a y direction or −y direction). In an embodiment, a region where the long side extending in the first direction (e.g., the x direction or −x direction) meets the short side extending in the second direction (e.g., the y direction or −y direction) may have a right angle shape or may have a round shape having a certain curvature. However, the planar shape of the display apparatus 1 is not limited to a rectangular shape, and may be another polygonal shape, a circular shape, or an elliptical shape.

The display apparatus 1 may include a display area DA and a peripheral area PA. The display area DA may display an image. In such an embodiment, pixels PX may be arranged in the display area DA. The display apparatus 1 may provide an image by using light emitted from the pixels PX. Each of the pixels PX may emit light by using a display element. In an embodiment, each of the pixels PX may emit red, green, or blue light. In an alternative embodiment, each of the pixels PX may emit red, green, blue, or white light.

The peripheral area PA is an area that does not provide an image and may be a non-display area. The peripheral area PA may at least partially surround the display area DA. In an embodiment, for example, the peripheral area PA may entirely surround the display area DA. In the peripheral area PA, a driver for providing an electrical signal to the pixels PX, a power supply line for providing power, or the like may be arranged. In an embodiment, for example, a scan driver for applying a scan signal to the pixels PX may be arranged in the peripheral area PA. In such an embodiment, a data driver for applying a data signal to the pixels PX may be arranged in the peripheral area PA.

In an embodiment, the peripheral area PA may include a pad area PDA to which a display circuit board 40 is connected, a bending area BA in which the display apparatus 1 is bent, and a connection area CA connected to the bending area BA.

Referring to FIG. 2, an embodiment of the display apparatus 1 may include the display panel 10, a cover window 20, a display driver 30, the display circuit board 40, a touch sensor driver 50, and a cover panel 400.

The display panel 10 may display information processed by the display apparatus 1. In an embodiment, for example, the display panel 10 may display execution screen information of an application driven by the display apparatus 1 or user interface ("UI") and graphical user interface ("GUI") information based on the execution screen information.

The display panel 10 may include a display element. In an embodiment, for example, the display panel 10 may be an organic light-emitting display panel using an organic light-emitting diode, a micro light-emitting diode display panel using a micro light-emitting diode, a quantum dot light-emitting display panel using a quantum dot light-emitting diode including a quantum dot emission layer, or an inorganic light-emitting display panel using an inorganic light-emitting diode including an inorganic semiconductor. Hereinafter, for convenience of description, embodiments in which the display panel 10 is an organic light-emitting display panel using an organic light-emitting diode as a display element will be described in detail.

The display panel 10 may include a substrate 100 and a multilayer film disposed on the substrate 100. In an embodiment, the display panel 10 may include the substrate 100, a display layer DSL, a thin-film encapsulation layer TFE, a touch sensor layer TSL, and an optical function layer OFL. In such an embodiment, the display area DA and the peripheral area PA may be defined in the substrate 100 and/or the multilayer film. In an embodiment, for example, the substrate 100 may include the display area DA and the peripheral area PA. In such an embodiment, the peripheral area PA may include the pad area PDA, the bending area BA, and the connection area CA.

The substrate 100 may include a polymer resin, such as polyethersulfone, polyarylate, polyetherimide, polyethylene naphthalate, polyethylene terephthalate, polyphenylene sulfide, polyimide, polycarbonate, cellulose triacetate, or cellulose acetate propionate. In an embodiment, the substrate 100 may have a multilayer structure including a base layer and a barrier layer (not shown), which includes the aforementioned polymer resin. The substrate 100 including a polymer resin may be flexible, rollable, or bendable.

The display layer DSL may be disposed on the substrate 100. In an embodiment, the display layer DSL may include pixel circuits and display elements. In such an embodiment, the pixel circuits may be connected to the display elements, respectively. Each of the pixel circuits may include a thin-film transistor and a storage capacitor. Accordingly, the display layer DSL may include a plurality of display elements, a plurality of thin-film transistors, and a plurality of storage capacitors. In such an embodiment, the display layer DSL may further include insulating layers therebetween.

The thin-film encapsulation layer TFE may be disposed on the display layer DSL. The thin-film encapsulation layer TFE may be disposed on the display elements and may cover the display elements. In an embodiment, the thin-film encapsulation layer TFE may include at least one inorganic encapsulation layer and at least one organic encapsulation layer. The at least one inorganic encapsulation layer may include at least one inorganic material selected from aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), and silicon oxynitride (SiON). The at least one organic encapsulation layer may include a polymer-based material. In an embodiment, for example, the polymer-based material may include an acrylic resin, an epoxy-based resin, polyimide, polyethylene, or the like. In an embodiment, the at least one organic encapsulation layer may include an acrylate.

The touch sensor layer TSL may be disposed on the thin-film encapsulation layer TFE. The touch sensor layer TSL may sense coordinate information according to an external input, for example, a touch event. The touch sensor layer TSL may include a sensor electrode and touch wiring lines connected to the sensor electrode. The touch sensor layer TSL may sense an external input by using a self-capacitance method or a mutual capacitance method.

In an embodiment, the touch sensor layer TSL may be formed on the thin-film encapsulation layer TFE during a manufacturing process. Alternatively, the touch sensor layer TSL may be separately formed on a touch substrate and then coupled to the thin-film encapsulation layer TFE through an adhesive layer, such as an optically transparent adhesive. In an embodiment, the touch sensor layer TSL may be formed directly on the thin-film encapsulation layer TFE. In such an embodiment, the adhesive layer may not be between the touch sensor layer TSL and the thin-film encapsulation layer TFE.

The optical function layer OFL may be disposed on the touch sensor layer TSL. The optical function layer OFL may reduce the reflectance of light (external light) incident from the outside toward the display apparatus 1, and/or may improve the color purity of light emitted from the display apparatus 1. In an embodiment, the optical function layer OFL may include a phase retarder and a polarizer. The phase retarder may be of a film type or a liquid crystal coating type, and may include a λ/2 phase delay and/or a λ/4 phase delay. The polarizer may also be of a film type or a liquid crystal coating type. The film type may include a stretched synthetic resin film, and the liquid crystal coating type may include liquid crystals arranged in a certain arrangement. The phase retarder and the polarizer may each further include a protective film.

In an alternative embodiment, the optical function layer OFL may include a black matrix and color filters. The color filters may be arranged by considering the color of light emitted from each of the pixels PX of the display apparatus 1. Each of the color filters may include a red, green, or blue pigment or dye. Alternatively, each of the color filters may further include quantum dots in addition to the pigment or dye. Alternatively, some of the color filters may not include the pigment or dye, and may include scattering particles, such as titanium oxide.

In an alternative embodiment, the optical function layer OFL may include a destructive interference structure. The destructive interference structure may include a first reflective layer and a second reflective layer, disposed on different layers. First reflected light and second reflected light respectively reflected from the first reflective layer and the second reflective layer may destructively interfere, and thus external light reflectance may be reduced.

The cover window 20 may be disposed on the display panel 10. The cover window 20 may protect the display panel 10. In an embodiment, the cover window 20 may be a flexible window. The cover window 20 may protect the display panel 10 by being easily bent by an external force without cracking or the like. The cover window 20 may include at least one selected from glass, sapphire, and plastic. The cover window 20 may include, for example, ultra-thin glass ("UTG") or colorless polyimide ("CPI"). In an embodiment, the cover window 20 may have a structure in which a flexible polymer layer is disposed on one surface of a glass substrate, or may include only a polymer layer.

The cover window 20 may be attached to the display panel 10 by an adhesive member. The adhesive member may be a transparent adhesive member such as an optically clear adhesive ("OCA") film. In addition, the adhesive member may be formed using various known adhesive materials. The adhesive member may be formed to have the form of a film and attached to an upper portion of the display panel 10 (e.g., an upper portion of the thin-film encapsulation layer TFE), or formed on the upper portion of the display panel 10 by various methods such as being formed in a material form and applied on the upper portion of the display panel 10.

The display circuit board 40 may be connected to the display panel 10. In an embodiment, the display circuit board 40 may be connected to the substrate 100 by a connection portion 60. In an embodiment, the connection portion 60 may be an extension of the substrate 100, as shown in FIGS. 1 and 2. In such an embodiment, the substrate 100 may be bent in the bending area BA. In such an embodiment, at least portions of a lower surface 100LS of the substrate 100 may face each other, and the pad area PDA of the substrate 100 may be located lower than other portions of the substrate 100. Accordingly, the area of the peripheral area PA recognized by a user may be reduced. FIG. 2 illustrates an embodiment in which only the substrate 100 is bent, but not being limited thereto. In an alternative embodiment, at least a portion of the display layer DSL, at least a portion of the thin-film encapsulation layer TFE, and at least a portion of the touch sensor layer TSL may also be in the bending area BA and the pad area PDA. In such an embodiment, at least a portion of the display layer DSL, at least a portion of the thin-film encapsulation layer TFE, and at least a portion of the touch sensor layer TSL may also be bent in the bending area BA.

The display circuit board 40 may be electrically connected, by an anisotropic conductive film, to the pad area PDA of the substrate 100 bent as described above.

Referring to FIG. 3, in an alternative embodiment, a connection portion 60 may be an extension of a display circuit board 40. In such an embodiment, the display circuit board 40 may include a bendable flexible printed circuit board ("FPCB"). The display circuit board 40 may be connected to a connection area CA and may be bent in a bending area BA. Hereinafter, for convenience of description, embodiments where the connection portion 60 is an extension of the substrate 100, as in FIG. 1, will be mainly described.

A display driver 30 may be disposed on the display circuit board 40. The display driver 30 may receive control signals and power voltages, and may generate and output signals and voltages for driving the display panel 10. The display driver 30 may include an integrated circuit ("IC").

A touch sensor driver 50 may be disposed on the display circuit board 40. The touch sensor driver 50 may include an IC. The touch sensor driver 50 may be attached to the display circuit board 40. The touch sensor driver 50 may be electrically connected to sensor electrodes of a touch sensor layer TSL of the display panel 10 through the display circuit board 40.

In an embodiment, a power supplier may be additionally disposed on the display circuit board 40. The power supplier may supply a driving voltage for driving pixels of the display panel 10 and the display driver 30.

A cover panel 400 may be disposed on a lower surface (a −z direction surface of FIG. 2) of the substrate 100. The cover panel 400 may absorb external shock to prevent the display panel 10 from being damaged. This will be described later.

Figure 4A:
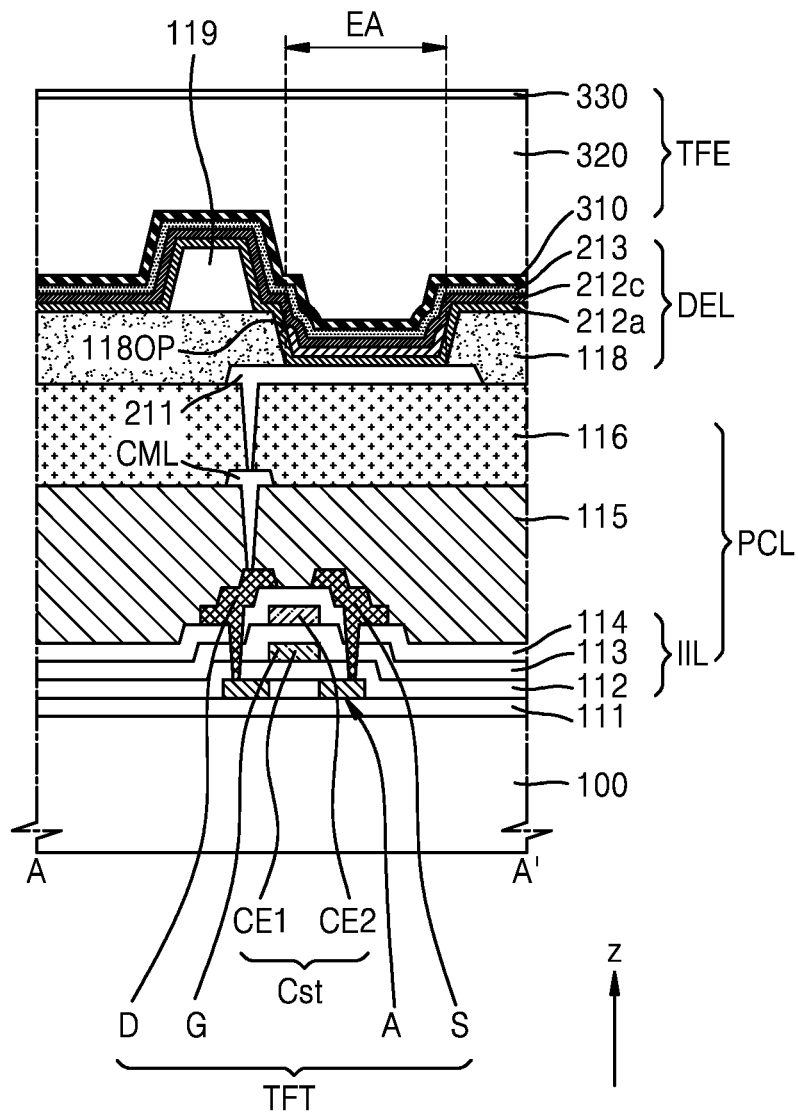
FIG. 4A is a schematic cross-sectional view of a display panel taken along line A-A' of FIG. 1.
Figure 4B:
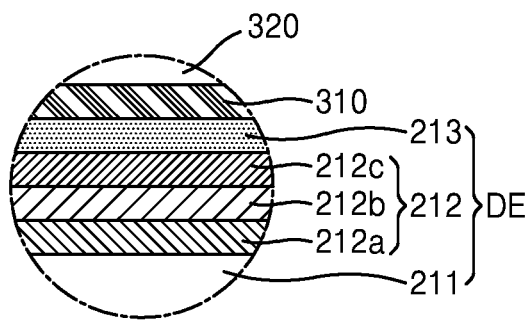
FIG. 4B is an enlarged view of the encircled portion of FIG. 4A.

FIG. 4A is a schematic cross-sectional view of a display panel taken along line A-A' of FIG. 1, and FIG. 4B is an enlarged view of the encircled portion of FIG. 4A.

Referring to FIGS. 4A and 4B, an embodiment of the display panel 10 may include the substrate 100, the display layer DSL, the thin-film encapsulation layer TFE, and the touch sensor layer TSL (refer to FIG. 2). The substrate 100 may include the display area DA and the peripheral area PA.

The display layer DSL may be disposed in the display area DA. The display layer DSL may include a buffer layer 111, a pixel circuit layer PCL, and a display element layer DEL.

The buffer layer 111 may be disposed on the substrate 100. The buffer layer 111 may include an inorganic insulating material, such as silicon nitride, silicon oxynitride, and silicon oxide, and may have a single layer structure or a multilayer structure, each layer herein including at least one selected from the inorganic insulating materials listed above.

The pixel circuit layer PCL may be disposed on the buffer layer 111. The pixel circuit layer PCL may include a thin-film transistor TFT included in a pixel circuit, an inorganic insulating layer IIL disposed below or/and above components of the thin-film transistor TFT, a first planarization layer 115, and a second planarization layer 116. The inorganic insulating layer IIL may include a first gate insulating layer 112, a second gate insulating layer 113, and an interlayer insulating layer 114.

The thin-film transistor TFT may include a semiconductor layer A, and the semiconductor layer A may include polysilicon. Alternatively, the semiconductor layer A may include amorphous silicon, an oxide semiconductor, or an organic semiconductor. The semiconductor layer A may include a channel region and a drain region and a source region respectively disposed at opposing sides of the channel region. A gate electrode G may overlap the channel region.

The gate electrode G may include a low-resistance metal material. The gate electrode G may include a conductive material including molybdenum (Mo), aluminum (Al), copper (Cu), titanium (Ti), or the like, and may have a multilayer structure or a single layer, each layer therein including at least one selected from the conductive materials listed above.

The first gate insulating layer 112 between the semiconductor layer A and the gate electrode G may include an inorganic insulating material, such as $SiO_2$, $SiN_x$, SiON, $Al_2O_3$, $TiO_2$, $Ta_2O_5$, hafnium oxide ($HfO_2$), or zinc oxide ($ZnO_x$). In this case, $ZnO_x$ may include zinc oxide (ZnO) and/or zinc peroxide ($ZnO_2$).

The second gate insulating layer 113 may be provided to cover the gate electrode G. Similar to the first gate insulating layer 112, the second gate insulating layer 113 may include an inorganic insulating material, such as $SiO_2$, $SiN_x$, SiON, $Al_2O_3$, $TiO_2$, $Ta_2O_5$, $HfO_2$, or $ZnO_x$. In this case, $ZnO_x$ may include ZnO and/or $ZnO_2$.

An upper electrode CE2 of a storage capacitor Cst may be disposed on the second gate insulating layer 113. The upper electrode CE2 may overlap the gate electrode G thereunder. In an embodiment, the gate electrode G and the upper electrode CE2, which overlap each other with the second gate insulating layer 113 therebetween, may form the storage capacitor Cst of the pixel circuit. In such an embodiment, the gate electrode G may function as a lower electrode CE1 of the storage capacitor Cst. In such an embodiment, the storage capacitor Cst and the thin-film transistor TFT may be formed to overlap each other. In an alternative embodiment, the storage capacitor Cst may be formed not to overlap the thin-film transistor TFT.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single layer structure or a multilayer structure, each layer therein including at least one selected from the materials listed above.

The interlayer insulating layer 114 may cover the upper electrode CE2. The interlayer insulating layer 114 may include an inorganic insulating material, such as $SiO_2$, $SiN_x$, SiON, $Al_2O_3$, $TiO_2$, $Ta_2O_5$, $HfO_2$, or $ZnO_x$. In this case, $ZnO_x$ may include ZnO and/or $ZnO_2$. The interlayer insulating layer 114 may have a single layer structure or a multilayer structure, each layer therein including at least one selected from the inorganic insulating materials listed above.

A drain electrode D and a source electrode S may both be disposed on the interlayer insulating layer 114. The drain electrode D and the source electrode S may each include a material having good conductivity. The drain electrode D and the source electrode S may each include a conductive material including Mo, Al, Cu, Ti, or the like, and may each have a multilayer structure or a single layer structure, each layer therein including at least one selected from the conductive materials listed above. In an embodiment, for example, the drain electrode D and the source electrode S may have a multilayer structure of Ti/Al/Ti.

The first planarization layer 115 may be disposed to cover the drain electrode D and the source electrode S. The first planarization layer 115 may include an organic insulating layer. The first planarization layer 115 may include an organic insulating material such as a general general-purpose polymer, such as polymethyl methacrylate ("PMMA") or polystyrene ("PS"), a polymer derivative having a phenol-based group, an acrylic polymer, an imide-based polymer, and an aryl ether-based polymer, an amide-based polymer, a fluorine-based polymer, a p-xylene-based polymer, a vinyl alcohol-based polymer, or a blend thereof.

The connection electrode CML may be disposed on the first planarization layer 115. In an embodiment, the connection electrode CML may be connected to the drain electrode D or the source electrode S through a contact hole defined in the first planarization layer 115. The connection electrode CML may include a material having high conductivity. The connection electrode CML may include a conductive material including molybdenum (Mo), aluminum (Al), copper (Cu), titanium (Ti), or the like, and may have a multilayer structure or a single layer structure, each layer therein including at least one selected from the conductive materials listed above. In an embodiment, for example, a connection electrode CML may have a multilayer structure of Ti/Al/Ti.

The second planarization layer 116 may be arranged to cover the connection electrode CML. The second planarization layer 116 may include an organic insulating layer. The second planarization layer 116 may include an organic insulating material, such as a general-purpose polymer, such as PMMA or PS, a polymer derivative having a phenolic group, an acryl-based polymer, an imide-based polymer, an acryl ether-based polymer, an amide-based polymer, a fluorine-based polymer, a p-xylene-based polymer, a vinyl alcohol-based polymer, or a blend thereof.

The display element layer DEL may be disposed on the pixel circuit layer PCL. The display element layer DEL may include a display element DE. The display element DE may be an organic light-emitting diode ("OLED"). A pixel electrode 211 of the display element DE may be electrically connected to the connection electrode CML through a contact hole defined in the second planarization layer 116.

The pixel electrode 211 may include a conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In an alternative embodiment, the pixel electrode 211 may include a reflective layer including Ag, Mg, Al, Pt, Pd, Au, Ni, Nd, Ir, Cr, or a compound thereof. In an alternative embodiment, the pixel electrode 211 may further include a layer including ITO, IZO, ZnO, or $In_2O_3$ above or under the reflective layer.

A pixel-defining layer 118 may be disposed on the pixel electrode 211, and an opening 118OP may be defined through the pixel-defining layer 118 to expose a central portion of the pixel electrode 211. The pixel-defining layer 118 may include an organic insulating material and/or an inorganic insulating material. The opening 118OP may define a light-emitting area EA (hereinafter, referred to as an emission area EA) of light emitted from the display element DE. In an embodiment, for example, the width of the opening 118OP may correspond to the width of the emission area EA of the display element DE.

A spacer 119 may be disposed on the pixel-defining layer 118. The spacer 119 may be used to prevent damage to the substrate 100 during a manufacturing process of a display apparatus. A mask sheet may be used when manufacturing a display panel. In this case, the spacer 119 may effectively prevent the mask sheet from entering into the opening 118OP of the pixel-defining layer 118 or being in close contact with the pixel-defining layer 118 to prevent a defect by a portion of the substrate 100 being damaged by the mask sheet when a deposition material is deposited on the substrate 100.

In an embodiment, the spacer 119 may include an organic insulating material, such as polyimide. Alternatively, the spacer 119 may include an inorganic insulating material, such as silicon nitride or silicon oxide, or may include an organic insulating material and an inorganic insulating material.

In an embodiment, the spacer 119 may include a material that is different from that of the pixel-defining layer 118. In an alternative embodiment, the spacer 119 may include a same material as that of the pixel-defining layer 118. In such an embodiment, the pixel-defining layer 118 and the spacer 119 may be formed together in a same mask process using a halftone mask or the like.

An intermediate layer 212 may be disposed on the pixel-defining layer 118. The intermediate layer 212 may include an emission layer 212b arranged in the opening 118OP of the pixel-defining layer 118. The emission layer 212b may include a high molecular weight or low molecular weight organic material that emits light of a certain color.

A first functional layer 212a and a second functional layer 212c may be disposed below and above the emission layer 212b, respectively. In an embodiment, for example, the first functional layer 212a may include a hole transport layer ("HTL") or include a HTL and a hole injection layer ("HIL"). The second functional layer 212c may be a component disposed on the emission layer 212b and may be optional. The second functional layer 212c may include an electron transport layer ("ETL") and/or an electron injection layer ("EIL"). The first functional layer 212a and/or the second functional layer 212c may be a common layer formed to entirely cover the substrate 100, like an opposite electrode 213 to be described later.

The opposite electrode 213 may include a conductive material having a low work function. In an embodiment, for example, the opposite electrode 213 may include a (semi) transparent layer including Ag, Mg, Al, Pt, Pd, Au, Ni, Nd, Ir, Cr, Li, Ca, or an alloy thereof. Alternatively, the opposite electrode 213 may further include a layer, such as ITO, IZO, ZnO, or $In_2O_3$, on the (semi) transparent layer including at least one selected from the material listed above.

In an embodiment, a capping layer (not shown) may be further disposed on the opposite electrode 213. The capping layer may include LiF, an inorganic material, and/or an organic material.

The thin-film encapsulation layer TFE may be disposed on the opposite electrode 213. In an embodiment, the thin-film encapsulation layer TFE may include at least one inorganic encapsulation layer and at least one organic encapsulation layer, and FIGS. 4A and 4B illustrates an embodiment in which the thin-film encapsulation layer TFE includes a first inorganic encapsulation layer 310, an organic encapsulation layer 320, and a second inorganic encapsulation layer 330, which are sequentially stacked one on another.

The first inorganic encapsulation layer 310 and the second inorganic encapsulation layer 330 may each include at least one inorganic material selected from aluminum oxide, titanium oxide, tantalum oxide, hafnium oxide, zinc oxide, silicon oxide, silicon nitride, and silicon oxynitride. The organic encapsulation layer 320 may include a polymer-based material. In an embodiment, for example, the polymer-based material may include an acrylic resin, an epoxy-based resin, polyimide, polyethylene, or the like. In an embodiment, the organic encapsulation layer 320 may include an acrylate.

As described above, a touch sensor layer may be disposed on the thin-film encapsulation layer TFE, and an optical function layer may be disposed on the touch sensor layer. The touch sensor layer may acquire coordinate information according to an external input, for example, a touch event. The optical function layer may reduce the reflectance of light (external light) incident from the outside toward a display apparatus, and/or may improve the color purity of light emitted from the display apparatus. In an embodiment, the optical function layer may include a phase retarder and/or a polarizer. The phase retarder may be of a film type or liquid crystal coating type, and may include a λ/2 phase delay and/or a λ/4 phase delay. The polarizer may also be of a film type or a liquid crystal coating type. The film type may include a stretched synthetic resin film, and the liquid crystal coating type may include liquid crystals arranged in a certain arrangement. The phase retarder and the polarizer may each further include a protective film.

An adhesive member may be disposed between the touch electrode layer and the optical function layer. As the adhesive member, a general adhesive member known in the art may be employed without limitation. The adhesive member may be a pressure sensitive adhesive ("PSA").

Figure 5:
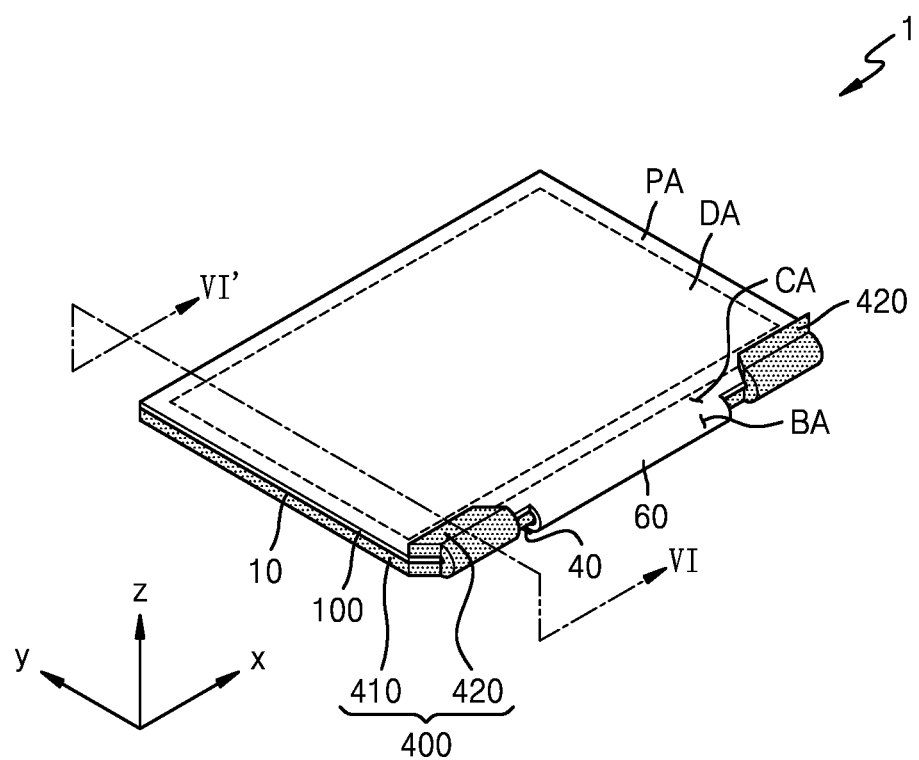
FIG. 5 is a schematic perspective view of a display apparatus according to an embodiment.
Figure 6:
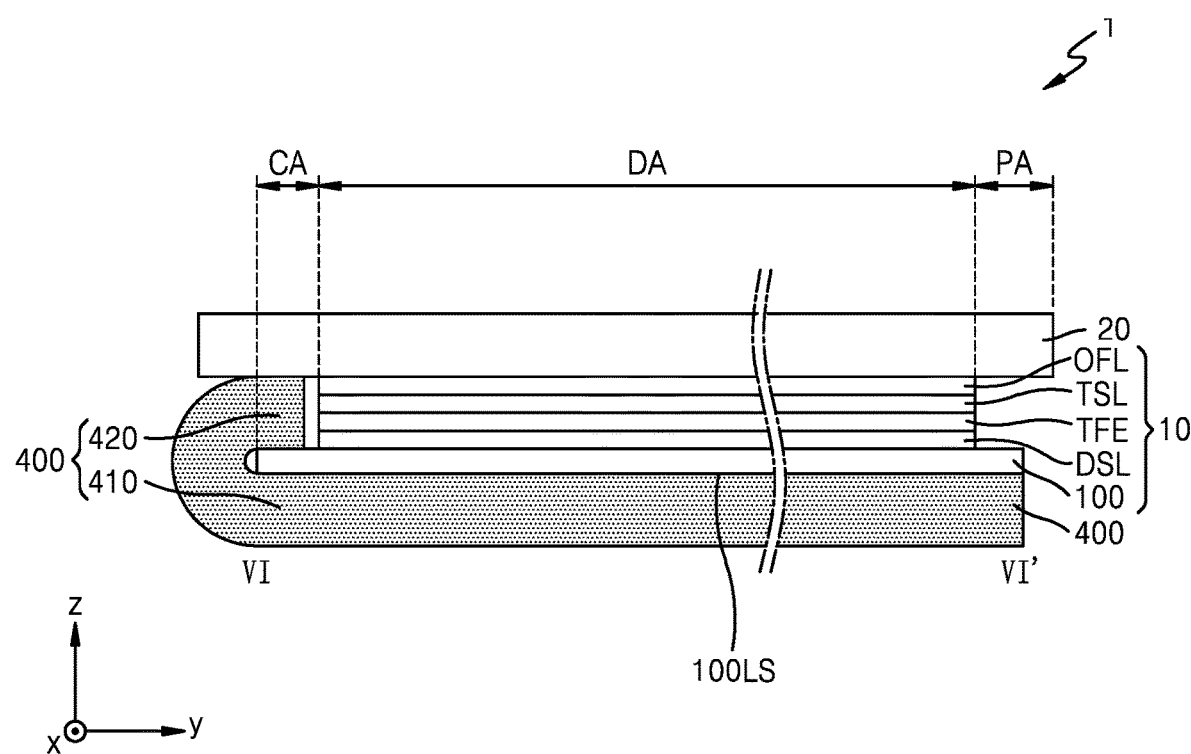
FIG. 6 is a cross-sectional view of the display apparatus taken along line VI-VI' of FIG. 5.
Figure 7:
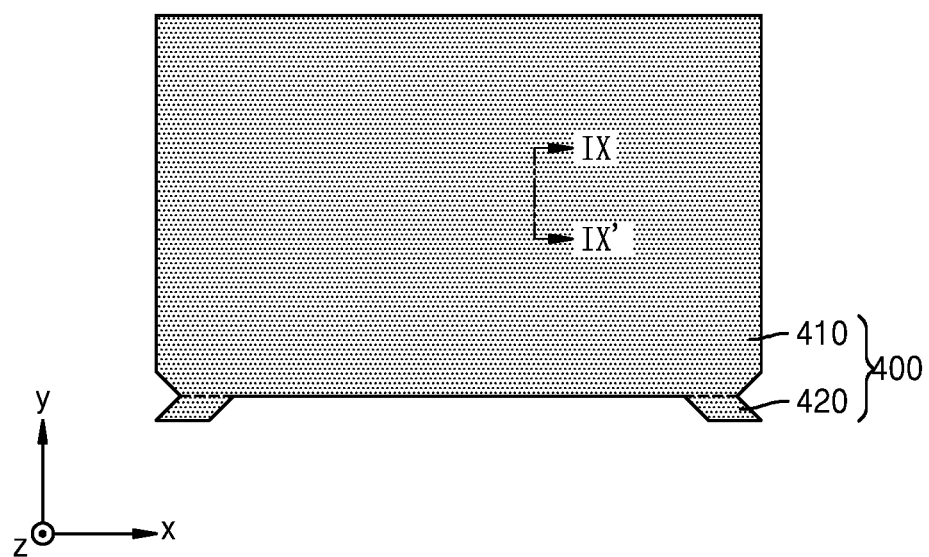
FIG. 7 is a plan view of a cover panel according to an embodiment.

FIG. 5 is a schematic perspective view of a display apparatus 1 according to an embodiment. Specifically, FIG. 5 is a perspective view of the display apparatus 1 of FIG. 1, in which layers on the substrate 100 are omitted for convenience of illustration. FIG. 6 is a cross-sectional view of the display apparatus 1 taken along line VI-VI' of FIG. 5. FIG. 7 is a plan view of a cover panel 400 according to an embodiment.

Referring to FIGS. 5 to 7, in an embodiment, the cover panel 400 may be disposed on a surface opposite to a surface of the substrate 100, on which a cover window 20 is disposed. The cover panel 400 may absorb external shock to prevent a display panel 10 from being damaged.

In an embodiment, the cover panel 400 may include a polymer resin, such as polyurethane, polycarbonate, polypropylene, or polyethylene, or include a material having elasticity, such as rubber and sponge formed by foam molding of a urethane-based material or acrylic material. Alternatively, the cover panel 400 may further include a metal material such as copper. In such an embodiment, for example, the cover panel 400 may include a first layer including or made of a polymer resin or a material having elasticity, and a second layer including or made of a metal material disposed under the first layer. Hereinafter, for convenience of description, embodiments in which the cover panel 400 has a single layer structure will be mainly described.

The cover panel 400 may include a body portion 410 and a buffer portion 420. The body portion 410 may be disposed on a lower surface (a −z direction surface of FIG. 5) of the substrate 100 and may cover one surface of the substrate 100. In an embodiment, the body portion 410 may be formed to have a size corresponding to the size of the substrate 100. In an embodiment, for example, where edges of the substrate 100 are cut to be inclined in the connection area CA, as shown in FIG. 5, the body portion 410 may also be formed to have an inclined edge to correspond thereto.

The body portion 410 may be disposed on the lower surface of the substrate 100, and the display circuit board 40 may be disposed under the body portion 410 (a −z direction in FIG. 5). The substrate 100 and the display circuit board 40 may be connected to each other by a connection portion 60. In an embodiment, the connection portion 60 may be formed by extending the substrate 100, and in such an embodiment, the connection portion 60 may be bent to connect the connection area CA of the substrate 100 to the display circuit board 40. In such an embodiment, the connection portion 60 may surround a portion of the side surface of the cover panel 400, specifically, of the side surface of the body portion 410.

The buffer portion 420 may extend from one side of the body portion 410, for example, a side on which the connection portion 60 is disposed (a −y direction in FIG. 5), and may be bent to be disposed on the substrate 100. In an embodiment, a plurality of buffer portions 420 may be formed. In an embodiment, for example, two buffer portions 420 may be formed, as shown in FIG. 5. The buffer portion 420 may be formed at opposing side portions of a same edge portion of the body portion 410 to sandwich the connection portion 60 therebetween. The buffer portion 420 may be bent and disposed on opposing side portions of the connection area CA of the substrate 100. In an embodiment, the buffer portion 420 may be adhered to the substrate 100 by an adhesive member.

In an embodiment, the buffer portion 420 may be formed to have a shape corresponding to the shape of the edge of the substrate 100, specifically, the connection area CA. In an embodiment, for example, where edges of the substrate 100 are cut to be inclined in the connection area CA, as shown in FIG. 5, the buffer portion 420 may also be formed to have an inclined edge in response thereto. In such an embodiment, the buffer portion 420 may have a rhombus shape on a plane.

Referring back to FIG. 6, the cover window 20 may be disposed above the buffer portion 420 and the substrate 100 (in the z direction of FIG. 6). A display layer DSL and a thin-film encapsulation layer TFE may not be stacked in (or may not overlap) the connection area CA of the substrate 100, and thus a space may be formed between the substrate 100 and the cover window 20. Due to the space between the substrate 100 and the cover window 20, when an external force is applied to the cover window 20 or the substrate 100, the cover window 20 or the substrate 100 may be damaged. According to an embodiment, the buffer portion 420 may prevent damage to the cover window 20 or the substrate 100 by filling the space between the substrate 100 and the cover window 20 in the connection area CA, in particular, at opposing sides of an edge of the connection area CA.

Figure 8:
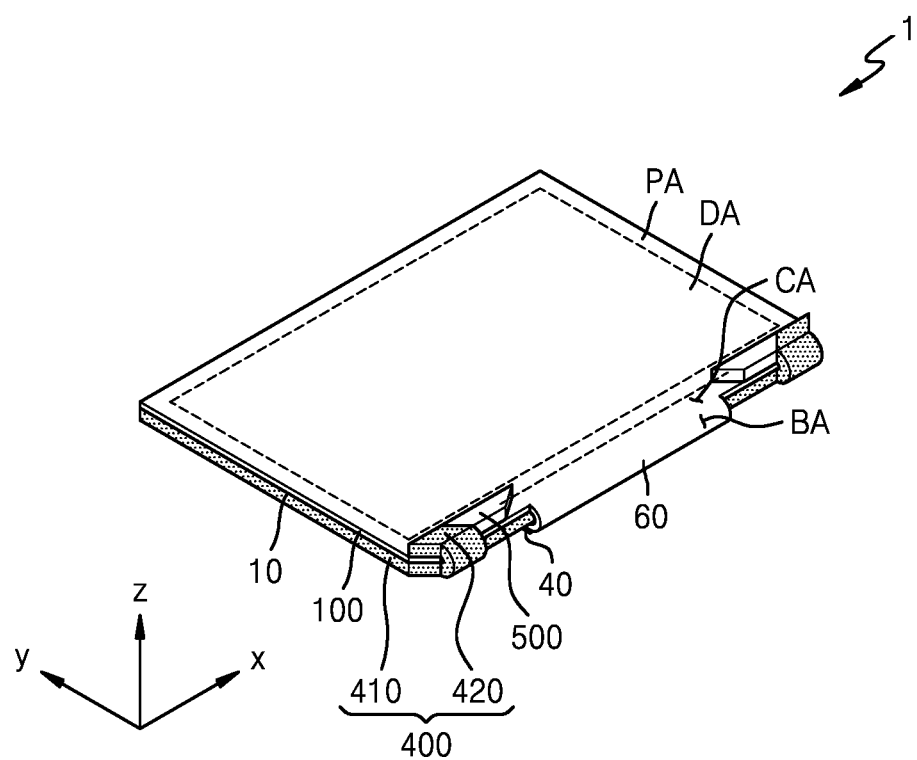
FIG. 8 is a schematic perspective view of a display apparatus according to an alternative embodiment.

FIG. 8 is a schematic perspective view of a display apparatus 1 according to an alternative embodiment.

The display apparatus 1 of FIG. 8 is substantially the same as the display apparatus 1 of FIG. 5 except that the display apparatus 1 of FIG. 8 may further include a spacer 500 disposed adjacent to the buffer portion 420. The spacer 500 may be disposed in the connection area CA of the substrate 100. In an embodiment, a plurality of spacers 500 (e.g., two spacers) may be arranged, and the plurality of spacers 500 may be arranged between a plurality of buffer portions 420. In such an embodiment, the spacer 500 and the buffer portion 420 may be arranged side-by-side. In such an embodiment, spacers 500 may be disposed on opposing side portions of the connection portion 60 so that the connection portion 60 is disposed between the plurality of spacers 500. The spacer 500 may be disposed between the substrate 100 and the cover window 20 together with the buffer portion 420 to fill the space between the substrate 100 and the cover window 20.

In an embodiment, the spacer 500 may include a material that is different from that of the buffer portion 420. In an embodiment, for example, the hardness of the buffer portion 420 may be lower than that of the spacer 500. Because stress may concentrate more at the edge of the substrate 100, the hardness of the buffer portion 420 may be lower than that of the spacer 500, thereby preventing damage to the substrate 100.

In such an embodiment where the spacer 500 is disposed together with the buffer portion 420, described above, a buffering effect may be further improved. In such an embodiment, as the buffer portion 420 buffers both sides of the connection area CA, where stress may concentrate, the buffering effect may be improved.

However, the disclosure is not limited thereto, and it may be understood that, in an alternative embodiment, the spacer 500 may be omitted and the buffer portion 420 may be extended to an area where the spacer 500 is disposed to replace the spacer 500.

Figure 9:
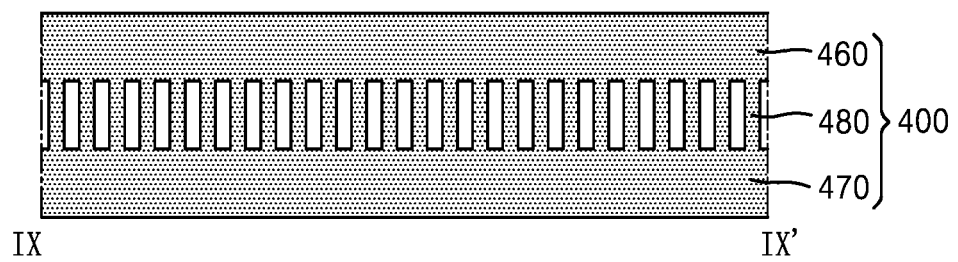
FIG. 9 is a cross-sectional view of the cover panel taken along line IX-IX' of FIG. 7, according to an embodiment.
Figure 10:
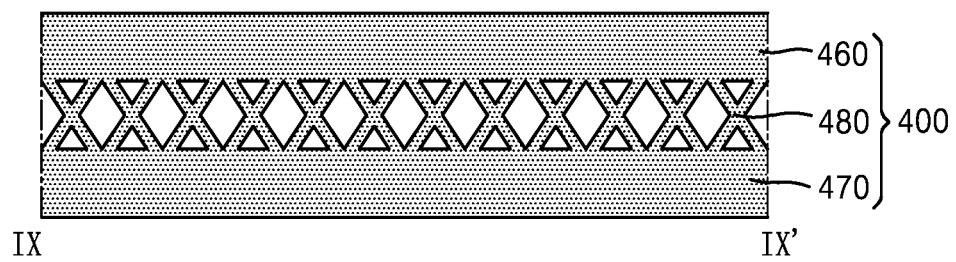
FIG. 10 is a cross-sectional view of the cover panel taken along line IX-IX' of FIG. 7, according to an alternative embodiment.

FIG. 9 is a cross-sectional view of the cover panel 400 taken along line IX-IX' of FIG. 7, according to an embodiment, and FIG. 10 is a cross-sectional view of the cover panel 400 taken along line IX-IX' of FIG. 7, according to an alternative embodiment.

Referring to FIG. 9, the cover panel 400 may include a buffer structure in a thickness direction (a z direction of FIG. 9). The buffer structure may be formed over the entire area of the cover panel 400, specifically, the body portion 410 and the buffer portion 420. In an alternative embodiment, the buffer structure may be provided only in one of the body portion 410 and the buffer portion 420. Hereinafter, for convenience of description, the case in which the buffer structure is provided over the entire area of the cover panel 400 will be mainly described.

The cover panel 400 may include a first layer 460 and a second layer 470 that are sequentially stacked in the thickness direction of the cover panel 400 (the z direction of FIG. 9). The first layer 460 and the second layer 470 may be apart to form a space. In such an embodiment, a plurality of support members 480 may be arranged between the first layer 460 and the second layer 470 to connect the first layer 460 and the second layer 470 to each other.

In an embodiment, the first layer 460, the second layer 470, and the support members 480 may be integrally formed with each other as a single unitary indivisible part. In such an embodiment, the first layer 460, the second layer 470, and the support members 480 may include a same material and may be connected to each other.

In an embodiment, the plurality of support members 480 may extend in a vertical direction (e.g., the z direction of FIG. 9) between the first layer 460 and the second layer 470. In such an embodiment, the plurality of support members 480 may be apart to be parallel to each other. Accordingly, the first layer 460, the second layer 470, and the plurality of support members 480 may form a buffer structure so that the cover panel 400 cushions a shock.

Referring to FIG. 10, in an alternative embodiment, the plurality of support members 480 may extend obliquely with respect to a vertical direction (e.g., in the z direction of FIG. 9) between the first layer 460 and the second layer 470. In such an embodiment, the plurality of support members 480 may be arranged to cross each other. In such an embodiment, the plurality of support members 480 may be in the form of a mesh that intersects in a front view. Accordingly, the first layer 460, the second layer 470, and the plurality of support members 480 may form a buffer structure so that the cover panel 400 cushions a shock.

In an embodiment, each of the support members 480 may have a bar shape, as shown in FIGS. 9 and 10, but is not limited thereto. Although not shown in the drawings, the support member 480 may be formed to have a buffer structure, such as a zigzag shape, an S-like shape, or an embossing shape.

Figure 11:
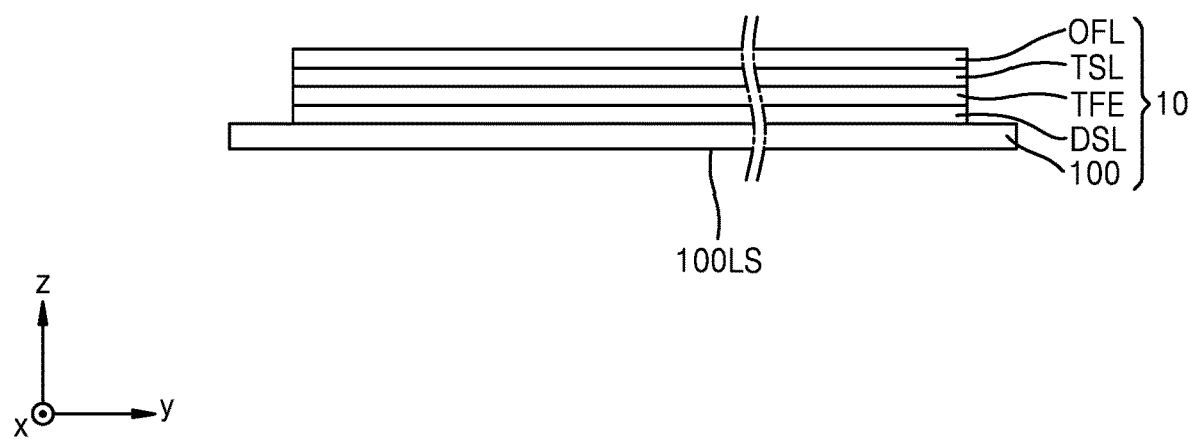
FIGS. 11 to 13 are schematic diagrams illustrating a method of manufacturing a display apparatus, according to an embodiment.
Figure 12:
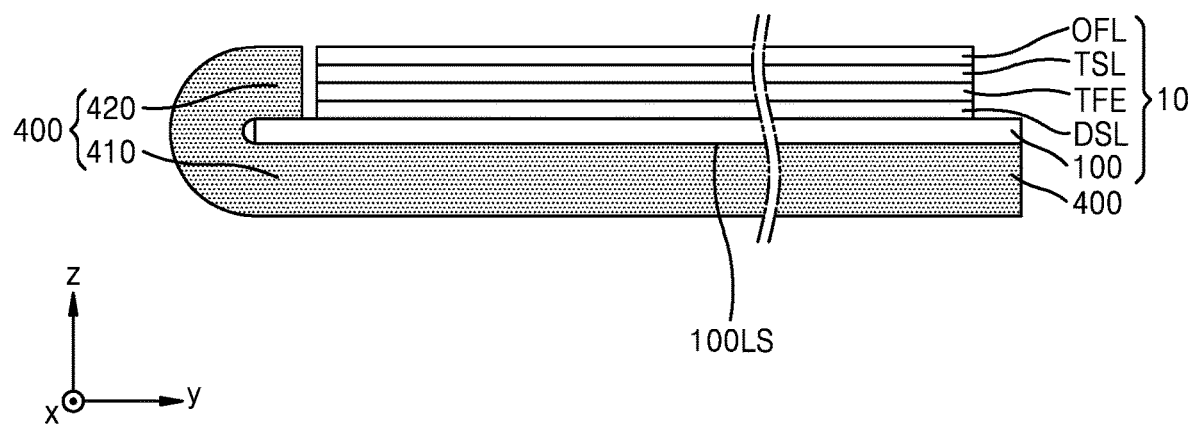
Figure 13:
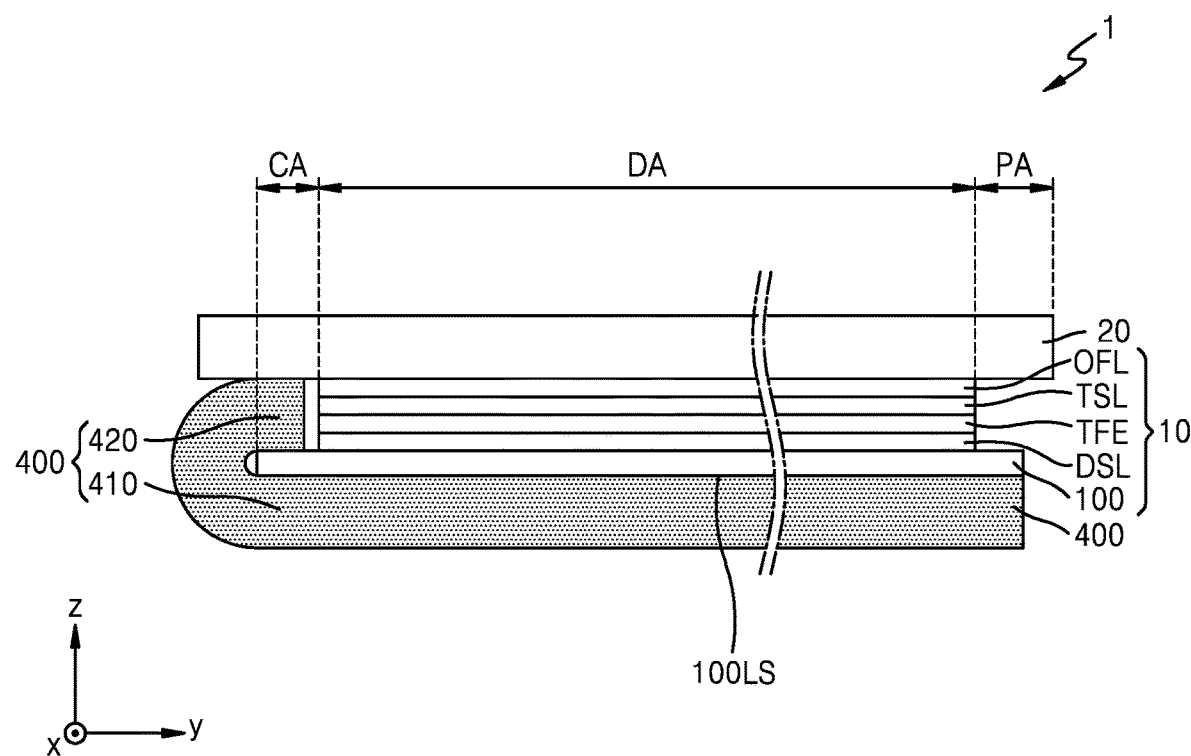

FIGS. 11 to 13 are schematic diagrams illustrating a method of manufacturing a display apparatus, according to an embodiment.

Referring to FIG. 11, in an embodiment of a method of manufacturing a display apparatus, a display layer DSL, an encapsulation layer TFE, a touch sensor layer TSL, and an optical function layer OFL, as described above, may be provided or stacked on a substrate 100. In such an embodiment, the layers may not be disposed in a connection area CA (see FIG. 13) of the substrate 100.

Referring to FIG. 12, a cover panel 400 may be attached to a lower surface (a −z direction surface of FIG. 12) of the substrate 100. The cover panel 400 may be bonded to the substrate 100 by, for example, an adhesive member. In such an embodiment, the cover panel 400 may include a body portion 410 and a buffer portion 420, as described above. The buffer portion 420 may extend from the body portion 410 and be bent to surround one side of the substrate 100, and may be attached to the connection area CA of the substrate 100, in particular, to opposing side portions of the connection area CA of the substrate 100. In an embodiment, a spacer 500 (see FIG. 8) may be attached to the connection area CA adjacent to a side of the buffer portion 420 facing the connection portion 60. The buffer portion 420 may be attached to the connection area CA and then the spacer 500 may be attached to the connection area CA, or vice versa, the spacer 500 may be attached to the connection area CA and then the buffer portion 420 may be attached to the connection area CA.

Next, referring to FIG. 13, a cover window 20 may be bonded to the buffer portion 420 and a display panel 10 to cover the buffer portion 420 and the display panel 10. In an embodiment, for example, the display panel 10 may be disposed on a pad and the cover window 20 may be disposed on a jig to face the display panel 10, and then the pad and/or the jig may move toward each other to bond the display panel 10 to the cover window 20. In such an embodiment, the buffer portion 420 may fill a space between the cover window 20 and the substrate 100 in the connection area CA and function as a buffer. Accordingly, damage to the cover window 20 or the substrate 100 may be prevented.

According to embodiments, a display apparatus capable of preventing damage to a display panel including a substrate and a method of manufacturing the display apparatus may be provided.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:
1. A display apparatus comprising:
 a substrate including a display area and a peripheral area surrounding the display area;
 a display layer disposed on the display area;
 a cover window covering the substrate; and a cover panel disposed on the substrate, wherein the substrate is disposed between the cover window and the cover panel, wherein the cover panel includes:
a body portion covering the substrate; and
a buffer portion extending from a side of the body portion and disposed between the substrate and the cover window.

2. The display apparatus of claim 1, wherein the buffer portion is disposed on the peripheral area.

3. The display apparatus of claim 1, further comprising:
a circuit board disposed on the cover panel, wherein the cover panel is disposed between the circuit board and the substrate,
wherein the circuit board is connected to the substrate by a connection portion.

4. The display apparatus of claim 3,
wherein the peripheral area includes a connection area to which the connection portion is connected,
wherein the buffer portion is disposed on opposing side portions of the connection area.

5. The display apparatus of claim 3,
wherein the buffer portion is provided in plural, and
wherein the connection portion is disposed between a plurality of buffer portions.

6. The display apparatus of claim 1, wherein the buffer portion is bent to surround a side portion of the substrate.

7. The display apparatus of claim 1, wherein the buffer portion is in contact with the substrate and the cover window.

8. The display apparatus of claim 1, wherein an edge of the buffer portion corresponds to an edge of the peripheral area.

9. The display apparatus of claim 1, further comprising:
a spacer disposed between the substrate and the cover window in the peripheral area,
wherein the buffer portion is disposed between the substrate and the cover window in the peripheral area and does not overlap the spacer in a thickness direction of the substrate.

10. The display apparatus of claim 9, wherein the buffer portion and the spacer include different materials from each other.

11. The display apparatus of claim 9, wherein the buffer portion is integrally formed with the spacer as a single unitary indivisible part.

12. The display apparatus of claim 1, wherein the buffer portion has a rhombus shape in a plan view.

13. The display apparatus of claim 1, wherein the cover panel includes a first layer and a second layer, which are disposed opposite to each other, and a plurality of support members between the first layer and the second layer and connected to the first layer and the second layer.

14. The display apparatus of claim 13, wherein the plurality of support members are apart from each other at a same interval and arranged side-by-side.

15. The display apparatus of claim 13, wherein the plurality of support members are disposed to cross each other.

16. A method of manufacturing a display apparatus, the method comprising:
providing a display layer on a display area of a substrate, wherein the substrate includes the display area and a peripheral area surrounding the display area;
attaching a cover panel to the substrate in a way such that the display layer is disposed between the cover panel and the substrate;
bending a buffer portion of the cover panel extending from a side of the cover panel in a way such that the buffer portion is disposed on the peripheral area of the substrate; and
disposing a cover window to cover the buffer portion and the display layer.

17. The method of claim 16, further comprising:
disposing a circuit board on the cover panel in a way such that the cover panel is disposed between the circuit board and the substrate; and
connecting the circuit board to the substrate by a connection portion.

18. The method of claim 17,
Wherein the buffer portion is provided in plural, and
the method further comprises disposing the connection portion between a plurality of buffer portions.

19. The method of claim 16, further comprising:
disposing the buffer portion on opposing side portions of the peripheral area.

20. The method of claim 16, wherein the cover panel includes a first layer and a second layer, which are disposed opposite to each other, and a plurality of support members disposed between the first layer and the second layer and connected to the first layer and the second layer.

* * * * *